United States Patent
Huang et al.

(10) Patent No.: US 9,030,151 B2
(45) Date of Patent: May 12, 2015

(54) SOLAR CELL PACK AND METHOD FOR BALANCING OUTPUT CURRENTS OF SOLAR CELL MODULES

(75) Inventors: Guisong Huang, Shanghai (CN); Jie Huang, Shanghai (CN)

(73) Assignee: Delta Electronics, Inc. (TW)

( * ) Notice: Subject to any disclaimer, the term of this patent is extended or adjusted under 35 U.S.C. 154(b) by 385 days.

(21) Appl. No.: 13/593,669

(22) Filed: Aug. 24, 2012

(65) Prior Publication Data
US 2013/0264877 A1 Oct. 10, 2013

(30) Foreign Application Priority Data
Apr. 9, 2012 (CN) .......................... 2012 1 0099702

(51) Int. Cl.
| H02J 7/00 | (2006.01) |
|---|---|
| H02J 7/16 | (2006.01) |
| H02J 7/24 | (2006.01) |
| H02J 7/06 | (2006.01) |
| H02J 7/34 | (2006.01) |
| H01L 31/02 | (2006.01) |
| H02J 7/04 | (2006.01) |
| H02J 1/10 | (2006.01) |

(52) U.S. Cl.
CPC .............. *H01L 31/02021* (2013.01); *H02J 7/04* (2013.01); *H02J 7/042* (2013.01); *H02J 7/045* (2013.01); *H02J 7/044* (2013.01); *H02J 2001/106* (2013.01); *Y02E 60/12* (2013.01); *Y02E 10/50* (2013.01)

(58) Field of Classification Search
CPC ............... H02J 7/35; H02J 7/355; H02J 7/04; H02J 7/042; H02J 7/044; H02J 7/045; H02J 2001/106; Y02E 60/12

USPC ......... 320/101, 156, 158, 159, 161, 162, 163; 307/52–53, 43, 75
See application file for complete search history.

(56) References Cited

U.S. PATENT DOCUMENTS

| 5,751,133 A | * | 5/1998 | Sato et al. ...................... 320/101 |
|---|---|---|---|
| 5,869,949 A | * | 2/1999 | Nishikawa et al. ............ 320/101 |
| 5,923,100 A | * | 7/1999 | Lukens et al. .................. 307/66 |
| 6,376,932 B1 | * | 4/2002 | Yang ............................... 307/66 |
| 6,433,522 B1 | * | 8/2002 | Siri ................................. 323/272 |
| 6,812,396 B2 | * | 11/2004 | Makita et al. .................. 136/244 |

(Continued)

FOREIGN PATENT DOCUMENTS

| CN | 101636847 | 1/2010 |
|---|---|---|
| CN | 201902973 | 7/2011 |
| TW | 201208226 | 2/2012 |

*Primary Examiner* — Stacy Whitmore
(74) *Attorney, Agent, or Firm* — Lowe Hauptman & Ham, LLP

(57) ABSTRACT

The present disclosure provides a solar cell pack and a method for balancing currents of solar cell modules. The solar cell pack includes a first solar cell module, a second solar cell module, a first balancer, a sampler and a controller. A negative pole of the first solar cell module is electrically connected to a positive pole of the second solar cell module. The first balancer is electrically connected to the first and the second solar cell modules in order to balance the current flowing through the both solar cell modules. An input terminal of the sampler is electrically connected to the first and the second solar cell modules. An output terminal of the sampler is electrically connected to an input terminal of the control unit. An output terminal of the control unit is electrically connected to an input terminal of the first balancer.

8 Claims, 8 Drawing Sheets

(56) References Cited

U.S. PATENT DOCUMENTS

| | | | |
|---|---|---|---|
| 7,042,195 B2* | 5/2006 | Tsunetsugu et al. | 320/101 |
| 7,986,122 B2* | 7/2011 | Fornage et al. | 320/101 |
| 8,093,757 B2 | 1/2012 | Wolfs | |
| 8,258,741 B2* | 9/2012 | Wu et al. | 320/101 |
| 2009/0079383 A1* | 3/2009 | Fornage et al. | 320/101 |
| 2011/0079263 A1* | 4/2011 | Avrutsky | 136/244 |
| 2011/0193515 A1* | 8/2011 | Wu et al. | 320/101 |
| 2012/0173031 A1* | 7/2012 | Parameswaran et al. | 700/295 |
| 2012/0274263 A1* | 11/2012 | Kung et al. | 320/101 |
| 2014/0225574 A1* | 8/2014 | Boda et al. | 320/162 |
| 2014/0319916 A1* | 10/2014 | Cummings | 307/53 |

\* cited by examiner

SOLAR CELL PACK AND METHOD FOR BALANCING OUTPUT CURRENTS OF SOLAR CELL MODULES

BACKGROUND OF THE INVENTION

1. Field of the Invention

The present disclosure relates to a field of solar cells, and more particularly to a solar cell pack and a method for balancing output currents of solar cell modules.

2. Description of the Prior Art

Solar cells are used as a kind of clean energy, and are favored by people more and more. The large-scale solar power plants which use multiple solar cell panels have already been grid-connected to generate electric power, and are getting improved gradually. However, there are many problems in forming an array with multiple solar cells. One of these problems is the output currents from the different solar cells are not equivalent when illumination is not even, and this problem reduces the power-generating ability of the solar cell panel.

The purpose of a solar cell optimizer is to increase the power-generating ability of the solar cell panel, and the solar cell optimizers are able to be applied to giant power solar plants and civil middle/small power solar plants. A balancer, one kind of the solar cell optimizer, is able to perform optimization to overcome the problem of uneven illumination to the surface of the solar cell panel, and thereby increases the power-generating ability.

A drawback of the conventional techniques is, when illumination is distributed evenly on the solar cell panels, the output currents of the respective solar cell or respective set of solar cell panels are equivalent, and therefore the balancer which balances the currents among solar cell panels to increase power-generating ability is not necessary. On the contrary, the power loss of the balancer per se reduces the power-generating ability of the solar cell panels.

SUMMARY OF THE INVENTION

The present disclosure provides a solar cell pack and a method for balancing output currents of solar cell modules, by which power loss of a balancer thereof can be reduced, so as to solve the above-mentioned technical problems.

To solve the foregoing problems, the present disclosure provides a solar cell pack, which includes a first solar cell module, a second solar cell module and a first balancer. A negative pole of the first solar cell module is electrically connected to a positive pole of the second solar cell module. The first balancer is electrically connected to the first and the second solar cell modules in order to balance the current flowing through the both solar cell modules. The solar cell pack further includes a sampler and a control unit. An input terminal of the sampler is electrically connected to the first and the second solar cell modules to respectively sample the voltages between two poles of the both solar cell modules, and sample the current between the first balancer and the both solar cell modules. An output terminal of the sampler is electrically connected to an input terminal of the control unit. An output terminal of the control unit is electrically connected to an input terminal of the first balancer.

Optionally, the first balancer has a first port thereof electrically connected to a positive pole of the solar cell pack, a second port thereof electrically connected to a negative pole of the solar cell pack, and a third port thereof electrically connected to a common terminal of the negative pole of the first solar cell module and the positive pole of the second solar cell module.

Optionally, the first balancer further includes a first switch, a second switch and a first inductor. The first switch and the second switch are connected in series and electrically coupled between the first port and the second port of the first balancer. A first terminal of the first inductor is electrically connected to the third port of the first balancer, and a second terminal of the first inductor is electrically connected to a common terminal of the first and second switches.

Optionally, a third solar cell module and a second balancer are further included. A negative pole of the second solar cell module is electrically connected to a positive pole of the third solar cell module. The second balancer is electrically connected to the second the third solar cell modules to balance the current flowing through the both solar cell modules. The output terminal of the control unit is electrically connected to an input terminal of the second balancer. The input terminal of the sampler is electrically connected to the third solar cell module to sample the voltages between two poles of the third solar cell module and the current among the second, third solar cell modules and the second balancer.

Optionally, a first port of the second balancer is electrically connected to the positive pole of the solar cell pack, a second port thereof is electrically connected to the negative pole of the solar cell pack, and a third port thereof is electrically connected to a common terminal of the negative pole of the second solar cell module and the positive pole of the third solar cell module.

Optionally, the second balancer further includes a third switch, a fourth switch and a second inductor. The third switch and the fourth switch are connected in series and electrically coupled between the first port and the second port of the second balancer. A first terminal of the second inductor is electrically connected to the third port of the second balancer, and the second terminal of the second inductor is electrically connected to a common terminal of the third and fourth switches.

The present disclosure further provides a method for balancing the output currents of the solar cell modules in the solar cell pack, which includes steps of: (a) sampling currents and the voltages of the first solar cell module and the second solar cell module, respectively; (b) determining an operation state of the first balancer, if it is in a turn-on state, then executing step (c), if it is in a stand-by state, then executing step (d); (c) calculating an absolute value of a difference between the currents of the first and second solar cell modules and determining if the absolute value is less than a predetermined current threshold, if so, then switching the first balancer to the stand-by state, if the absolute value is greater than or equals to the predetermined current threshold, then returning to step (a); (d) calculating an absolute value of a difference between the voltages of the first and second solar cell modules and determining if the absolute value is less than a predetermined voltage threshold, if the absolute value is greater than or equals to the predetermined voltage threshold, then switching the first balancer to the turn-on state, if the absolute value is less that the predetermined voltage threshold, then returning to step (a).

Optionally, the solar cell pack further includes a third solar cell module and a second balancer. A negative pole of the second solar cell module is electrically connected to a positive pole of the third solar cell module. The second balancer is electrically connected to the second the third solar cell modules. The output terminal of the control unit is electrically connected to the input terminal of the second balancer. The input terminal of the sampler is electrically connected to the third solar cell module. The method further includes steps of: (a1) sampling currents and voltages of the second solar cell module and the third solar cell module, respectively; (b1) determining an operation state of the second balancer, if it is in a turn-on state, then executing step (e1), if it is in a stand-by state, then executing step (d1); (e1) calculating an absolute value of a difference between the currents of the second and third solar cell modules and determining if the absolute value is less than a predetermined current threshold, if so, then switching the second balancer to the stand-by state, if the absolute values is greater than or equals to the predetermined current threshold, then returning to step (a1); (d1) calculating an absolute value of a difference between the voltages of the second and third solar cell modules and determining if the absolute value is less than a predetermined voltage threshold, if the absolute values is greater than or equals to the predetermined voltage threshold, then switching the second balancer to the turn-on state, if the absolute values is less than the predetermined voltage threshold, then returning to step (a1).

The advantage of the present disclosure is that a closed loop control is implemented to the balancer by providing the sampler and the control unit. If the solar cells receive even illumination, then the balancer is controlled to be in the stand-by state. If the solar cells receive uneven illumination, then the balancer is "wakened", thereby the goal of reducing power loss is reached.

DETAILED DESCRIPTION OF THE INVENTION

The solar cell pack and the method for balancing output currents of solar cell modules in accordance with the present disclosure will be described in detail as follows in conjunction with the appending drawings.

First of all, a first embodiment of the present disclosure is described with reference to the drawings.

Figure 1A:
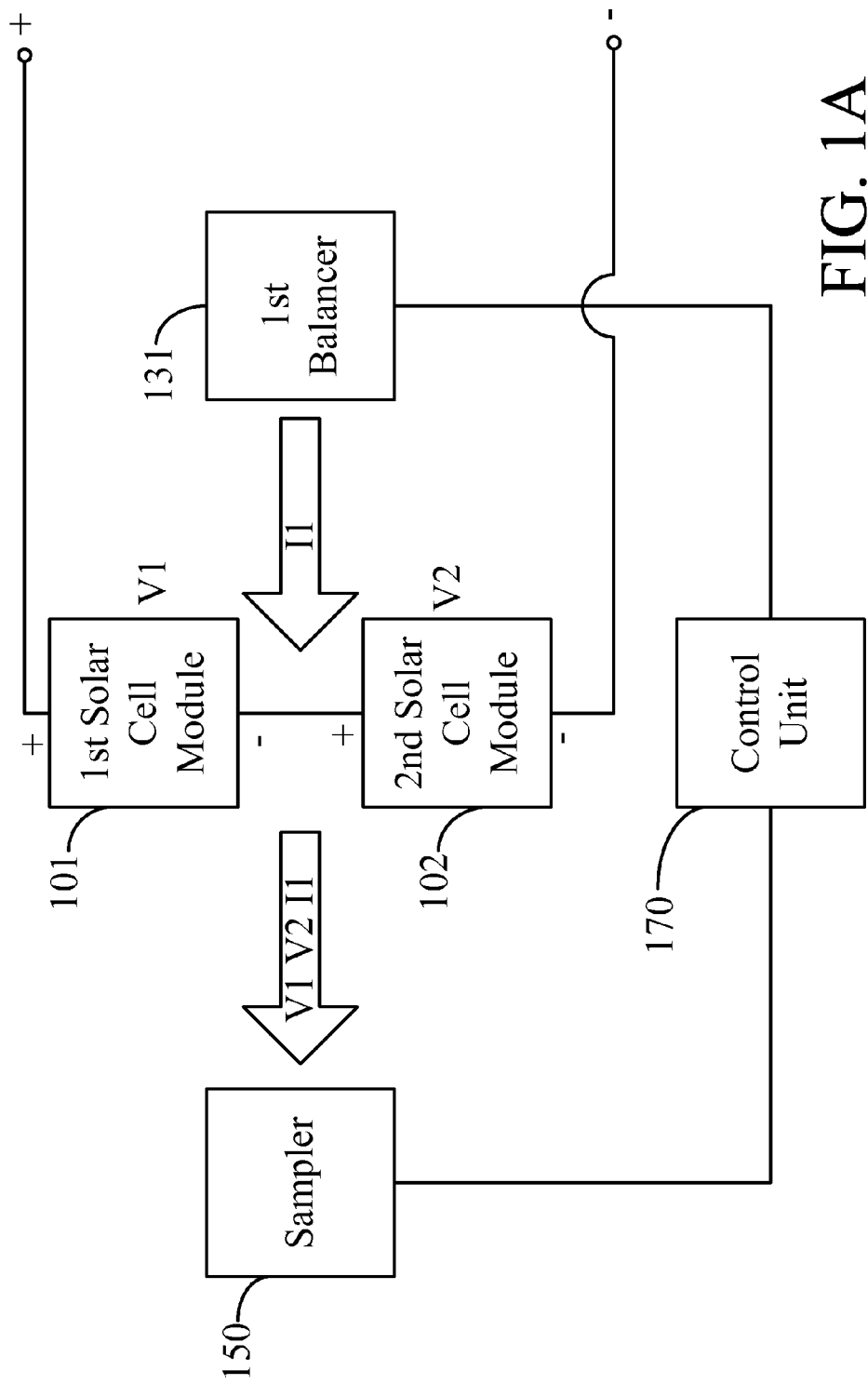
FIG. 1A is a block diagram showing a solar cell pack according to a first embodiment of the present disclosure.

FIG. 1A is a block diagram showing a solar cell pack according to the first embodiment of the present disclosure. The solar cell pack includes a first solar cell module 101, a second solar cell module 102, a first balancer 131, a sampler 150 and a control unit 170. The first solar cell module 101 and the second solar cell module 102 may be two solar cell panels, or two substrings in one cell panel. A negative pole of the first solar cell module 101 is electrically connected to a positive pole of the second solar cell module 102. The first balancer 131 is electrically connected to the first solar cell module 101 and the second solar cell module 102 in order to balance the currents flowing through the both solar cell modules. An input terminal of the sampler 150 is electrically connected to the first solar cell module 101 and the second solar cell module 102, samples the voltages V1 and V2 between two poles of the first solar cell module 101 and the second solar cell module 102, and samples the current I1 between the two solar cell modules and the first balancer 131. An output terminal of the sampler 150 is electrically connected to an input terminal of the control unit 170, and an output terminal of the control unit 170 is electrically connected to an input terminal of the first balancer 131.

Please still refer to FIG. 1A. The sampler 150 of the solar cell pack mainly samples the voltage V1 between the two poles of the first solar cell module 101, the voltage V2 between the two poles of the second solar cell module 102, and the current I1 between the two solar cell modules and the first balancer 131, and sends the voltage V1, the voltage V2 and the current I1 to the control unit 170. Under even illumination, the first balancer 131 is in a stand-by state, there is almost no power loss, and the current I1 between the two solar cell modules and the first balancer 131 is zero.

Figure 1B:
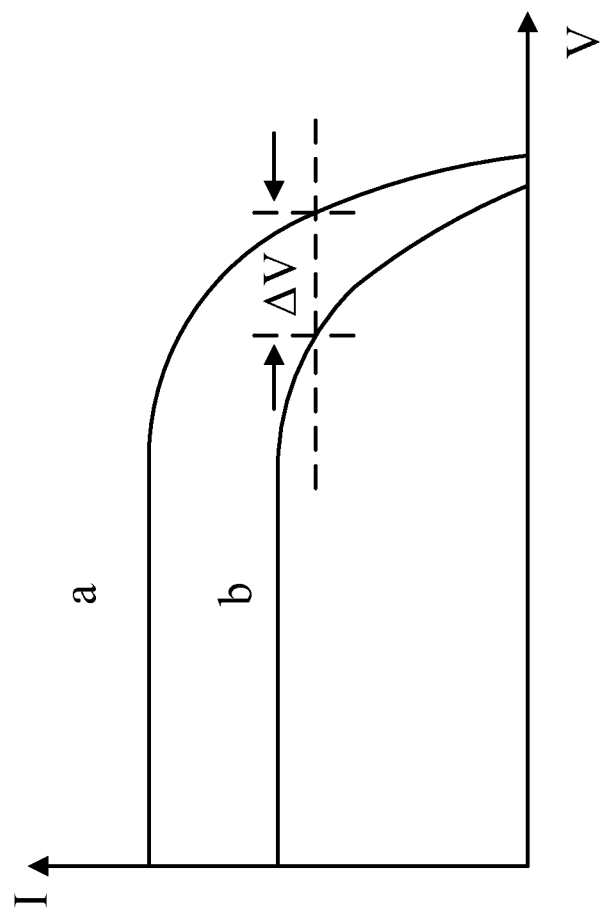
FIG. 1B schematically illustrates relationships between the voltage and current of the circuit shown in FIG. 1A under a condition where illumination varies.

FIG. 1B schematically illustrates relationships between the voltage and current of the above-described circuit under a condition where illumination varies. A curve "a" in the diagram represents the variation of the output current changing with the voltage of the first solar cell module 101, and the curve "b" represents the variation of the output current changing with the voltage of the second solar cell module 102. When the evenness of the illumination changes (e.g. the illumination to the second solar cell module 102 decreases), the output currents of the two modules would be different. As the output voltages of the solar cell increase, the output currents of the two solar cell modules decrease. When the output currents are at a certain current value, the sampler 150 detects a voltage difference between the first solar cell module 101 and the second solar cell module 102 as $|\Delta V|=|V1-V2|>A$ (A is a predetermined voltage threshold), and the control unit 170 determines that the illumination to the two solar cell modules is not even and sends an enable signal to switch the first balancer 131 into a turn-on state from the stand-by state.

After being switched into the turn-on state, the first balancer 131 outputs a compensation current $\Delta I$, of which the value is equal to I1, to the first solar cell module 101 and the second solar cell module 102 to keep operation voltages of the two solar cell modules equal. At this moment, the two solar cell modules both retain the maximum output powers.

Figure 1C:
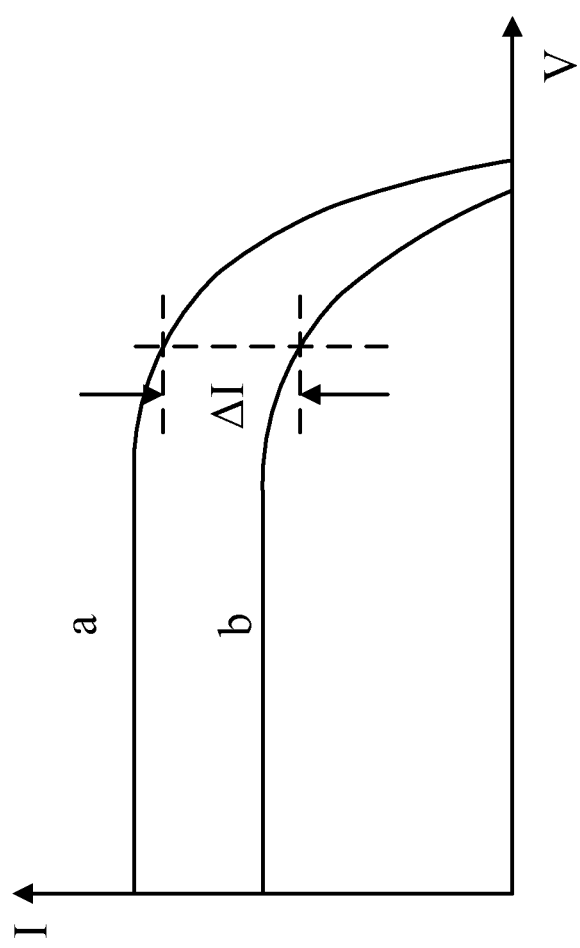
FIG. 1C schematically illustrates relationships between the voltage and current of the circuit shown in FIG. 1A under a condition where the illumination varies from uneven to even.

FIG. 1C schematically illustrates relationships between the voltage and current of the above-described circuit under a condition where the illumination varies from uneven to even. When illumination to the first solar cell module 101 and the illumination to the second solar cell module are equal, output currents from the two solar cell modules are equal, then the current I1 outputted by the first balancer 131 is reduced to zero. When the output voltage is at a certain voltage value, the sampler 150 detects that $|I1|<B$ (B is a predetermined current threshold), the control unit 170 determines that the first solar cell module 101 and the second solar cell module 102 receive even illumination and sends a disable signal for controlling the first balancer 131 to be switched into the stand-by state so as to save energy. It is confirmed by experiments that the solar cell receives even illumination, and the power consumption of the balancer is reduced to decades of milliwatts from several watts when it enters into the stand-by state. The efficiency of the whole system is promoted by 1% accordingly.

Figure 1D:
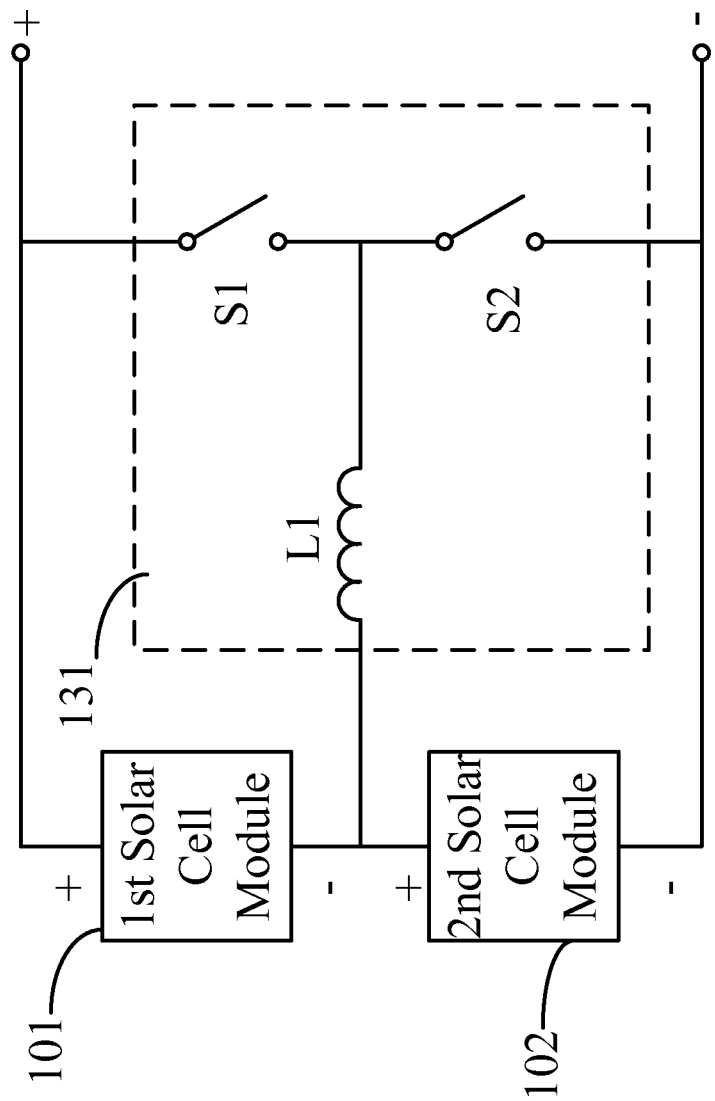
FIG. 1D shows a circuit diagram of a first balancer of the solar cell pack shown in FIG. 1A.

FIG. 1D shows a circuit diagram of a first balancer of the solar cell pack shown in FIG. 1A. The first balancer 131 has a first port electrically connected to a positive pole of the solar cell pack, a second port electrically connected to a negative pole of the solar cell pack, and a third port electrically connected to a common terminal of the negative pole of the first solar cell module 101 and the positive pole of the second solar cell module 102.

The sampler 150 shown in FIG. 1A can be implemented by any usual voltage and current sampling circuit, and the control unit 170 can be implemented by any type of microcontroller circuit such as an MCU (Micro Control Unit), and the detailed descriptions thereof are omitted herein.

Please still refer to FIG. 1D, the first balancer 131 further comprises a first switch S1, a second switch S2 and a first inductor L1. The first switch S1 and the second switch S2 are connected in series and electrically coupled between the first and second ports of the first balancer 131. A first terminal of the first inductor L1 has electrically connected to the third port of the first balancer 131, and a second terminal of the first inductor L1 is electrically connected to a common terminal of the first switch S1 and the second switch S2.

Please still refer to FIG. 1D, the first switch S1 and the second switch S2 are externally controlled to be turned on or off. Driving signals for the first switch S1 and second switch S2 are complementary to each other and duty cycles of the two driving signals are both 50%. When the first balancer 131 operates, the voltages of the first solar cell pack 101 and the second solar cell module 102 are maintained equal, and the compensation current ΔI flows through the first inductor L1. The sampler 150 detects the voltages V1 and V2 and the control unit 170 controls the first balancer 131 to switch from the stand-by state to turn-on state accordingly. Further, the control unit 170 controls the first balancer 131 to switch from the turn-on state to the stand-by state by detecting the current I1.

In the present embodiment, the detection of the current I1 can be done by detecting the current of the first inductor L1 through direct coupling. As can be seen from FIG. 1D, the value of the current flowing through the first inductor L1 is the current I1. Maybe the current I1 can also be indirectly obtained by detecting currents of the first switch S1 and the second switch S2. As can be known from the circuit shown in FIG. 1D, $I_{S1}=I_{S2}=0.5I1$.

A second embodiment of the solar cell pack in accordance with the present disclosure will be described as follows in conjunction with the appending drawings.

Figure 2A:
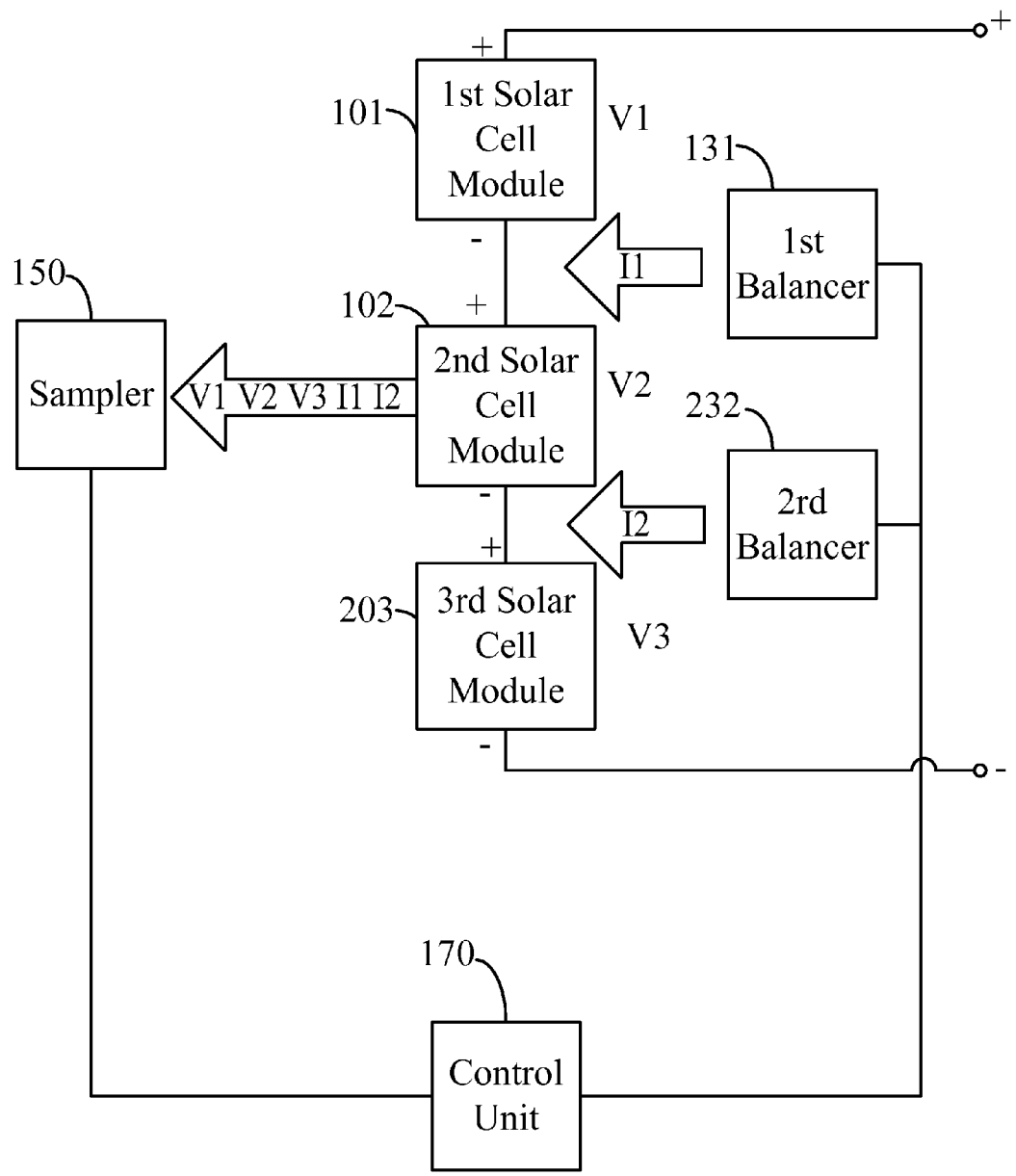
FIG. 2A is a block diagram showing a solar cell pack according to a second embodiment of the present disclosure.

FIG. 2A is a block diagram showing a solar cell pack according to the second embodiment of the present disclosure. The solar cell pack comprises a first solar cell module 101, a second solar cell module 102, a third solar cell module 203, a first balancer 131, a second balancer 232, a sampler 150 and a control unit 170. The first solar cell module 101, the second solar cell module 102 and the third solar cell module 203 can be implemented as three solar cell panels and three substrings of a single solar cell panel. A negative pole of the first solar cell module 101 is electrically connected with a positive pole of the second solar cell module 102, a negative pole of the second solar cell module 102 is electrically connected with a positive pole of the third solar cell module 203. The first balancer 131 is electrically connected to the first solar cell module 101 and the second solar cell module 102 for balancing the current flowing through the two solar cell modules. The second balancer 232 is electrically connected to the second solar cell module 102 and the third solar cell module 203 for balancing the current flowing through the two solar cell modules. An input terminal of the sampler 150 is electrically connected with the first solar cell module 101, the second solar cell module 102 and the third solar cell module 203 for respectively sampling a voltage V1 between the two poles of the first solar cell module 101, a voltage V2 between the two poles of the second solar cell module 102, a voltage V3 between the two poles of the third solar cell module 203, a current I1 between the first and second solar cell module 101, 102 and the first balancer 131, and a current I2 between the second and third solar cell modules 102, 203 and the second balancer 232. An output terminal of the sampler 150 is electrically connected with an input terminal of the control unit 170. An output terminal of the control unit 170 is electrically connected with the input terminal of the first balancer 131 and the second balancer 232.

The present embodiment aims to compensation to three solar cell panels or three substrings in a single cell panel, which is different from the previous embodiment. In the present embodiment, the currents I1 and I2 can be compensated, respectively, so as to maintain the voltages of the three solar cell modules equal. When the first balancer 131 and the second balancer 232 are in a stand-by state, the sampler 150 shown in FIG. 2A detects V1, V2 and V3 at the same time. When |V1−V2|>A or |V2−V3|>A (A is a predetermined voltage threshold), it means that illumination to the three solar cell module is uneven. The first balancer 131 and the second balancer 232 are controlled to be activated at the same time for outputting a compensate current ΔI1, of which the value is equal to I1, to the first solar cell module 101 and the second solar cell module 102, and outputting a compensation current ΔI2, of which the values is equal to I2, to the second solar cell module 102 and the third solar cell 203, so as to maintain the operation voltages of the three solar cell modules equal. At this moment, the three solar cell modules are all maintained to have the maximum output powers. When the first balancer 131 and the second balancer 232 are in a turn-on state, the sampler 150 shown in FIG. 2A detects I1 and I2 at the same time. When the value of any one of I1 and I2 is less than a certain predetermined current threshold, the control unit 170 controls the first balancer 131 and the second balancer 232 to enter into the stand-by state to save energy consumption.

Figure 2B:
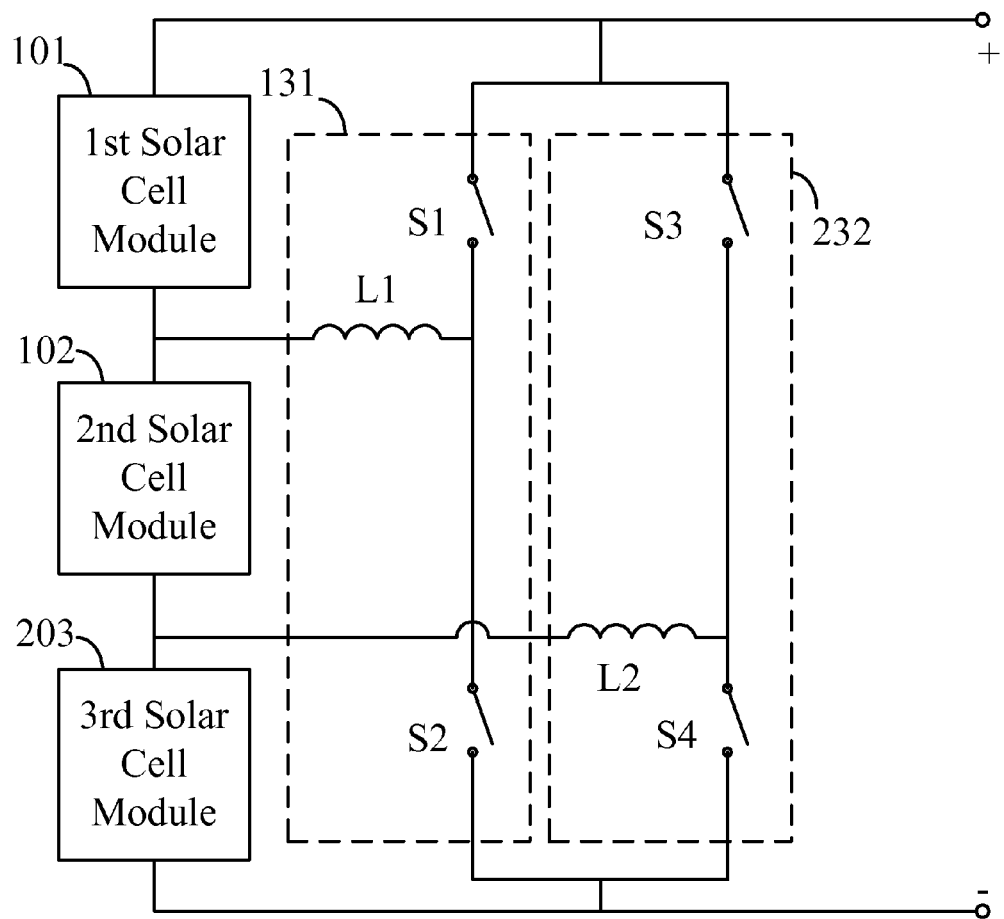
FIG. 2B illustrates a circuit diagram of a first balancer and a second balancer of the solar cell pack shown in FIG. 2A.

FIG. 2B illustrates a circuit diagram of the first balancer and the second balancer of the solar cell pack shown in FIG. 2A. The first balancer 131 has a first port electrically connected to a positive pole of the solar cell pack, a second port electrically connected to a negative pole of the solar cell pack, and a third port electrically connected to a common terminal of the negative pole of the first solar cell module 101 and the positive pole of the second solar cell module 102. The second balancer 232 has a first port electrically connected to the positive pole of the solar cell pack, a second port electrically connected to the negative pole of the solar cell pack, and a third port electrically connected to a common terminal of the negative pole of the second solar cell module 102 and the positive pole of the third solar cell module 203.

Please still refer to FIG. 2B, the first balancer 131 further comprises a first switch S1, a second switch S2 and a first inductor L1. The first switch S1 and the second switch S2 are connected in series and electrically coupled between the first and second ports of the first balancer 131. A first terminal of the first inductor L1 has electrically connected to the third port of the first balancer 131, and a second terminal of the first inductor L1 is electrically connected to a common terminal of the first switch S1 and the second switch S2. The second balancer 232 further comprises a third switch S3, a fourth switch S4 and a second inductor L2. The third switch S3 and the fourth switch S4 are connected in series and electrically coupled between the first and second ports of the second balancer 232. A first terminal of the second inductor L2 has electrically connected to the third port of the second balancer 232, and a second terminal of the second inductor L2 is electrically connected to a common terminal of the third switch S3 and the fourth switch S4.

Driving signals for the first switch S1 and the second switch S2 in the first balancer 131 shown in FIG. 2B are complementary to each other, and turn-on duty cycles of the two driving signals are ⅓ and ⅔, respectively. Driving signals for the third switch S3 and the fourth switch S4 in the second balancer 232 are complementary to each other, and turn-on duty cycles of the two driving signals are ⅔ and ⅓, respectively. The current I1 is compensated by the first balancer 131, and the current I2 is compensated by the second balancer 232, and thereby maintaining operation voltages of the first solar cell module 101, the second solar cell module 102 and the solar cell module 203 equal. The details about the turning on and off logics of the two balancers as well as the current balance can be referred to the descriptions of the first embodiment, and therefore the similar descriptions are omitted herein.

The methods in accordance with embodiments of the present disclosure will be described in conjunction with the appending drawings.

Figure 3A:
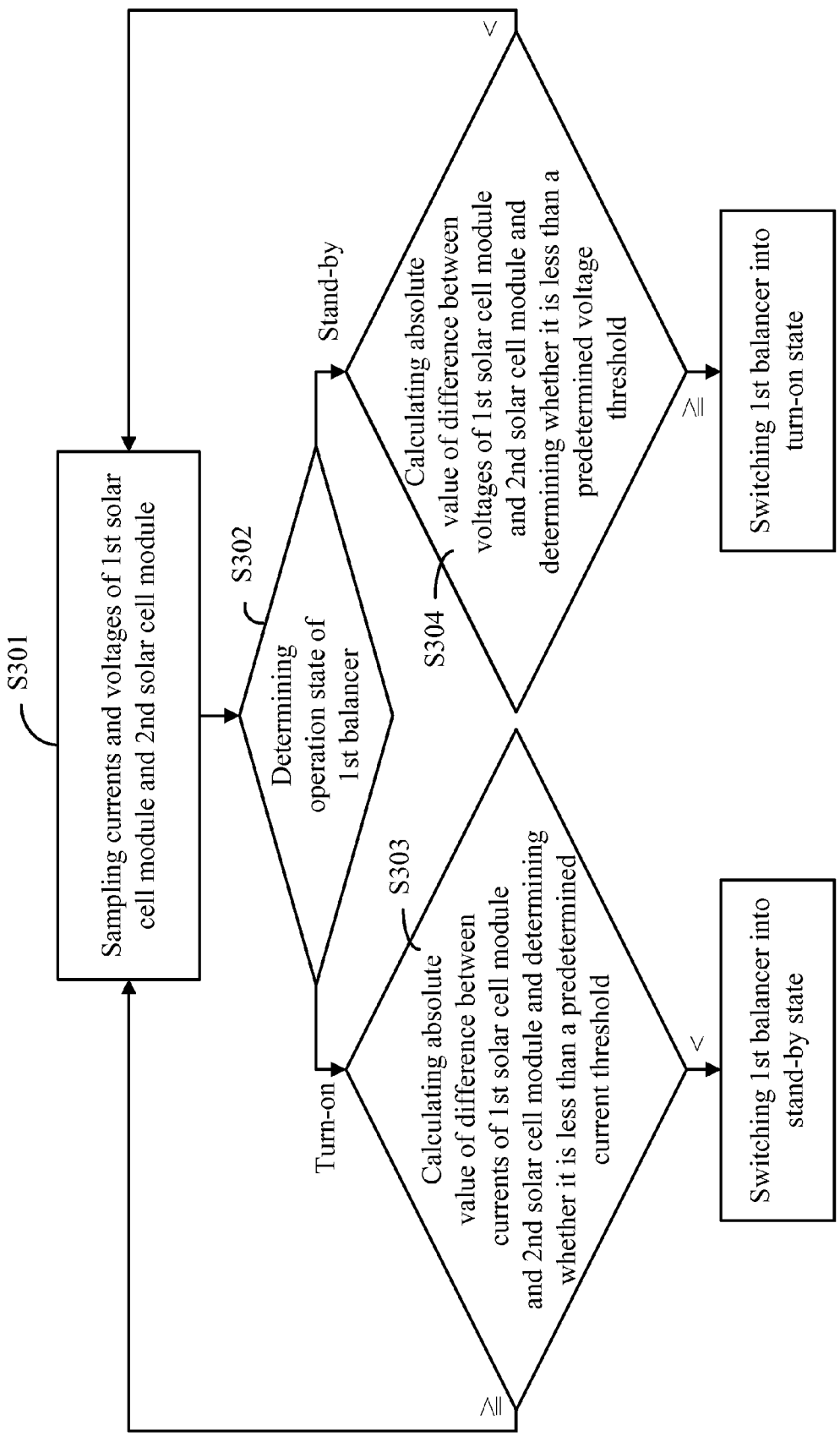
FIG. 3A and FIG. 3B show flow charts of methods according to embodiments of the present disclosure.

FIG. 3A shows a flow chart of a method according to an embodiment of the present disclosure. The method comprises steps of: step S301. sampling current values and voltage values of the first solar cell module and the second solar cell module, respectively; step S302. determining an operation state of the first balancer; step S303. calculating an absolute value of a difference between the current value of the first solar cell module and the current value of the second solar cell module and determining whether the absolute value is less than a predetermined current threshold; step S304. calculating an absolute value of a difference between the voltage value of the first solar cell module and the voltage value of the second solar cell module and determining whether the absolute value is less than a predetermined voltage threshold.

The above steps will be particularly explained with reference to FIG. 1A to FIG. 1C.

In step S301, the current values and voltage values of the first solar cell module 101 and the second solar cell module 102 shown in FIG. 1A are sampled, respectively. The sampling results will be used to determine whether outputs of the two solar cell modules are equal, and further determine whether to activate the first balancer 131 or not.

In step S302, the operation state of the first balancer 131 is determined. If it is the turn-on state, then step S303 is executed. If it is the stand-by state, then step S304 is executed.

In step S303, the absolute value of a difference between the current value of the first solar cell module and the current value of the second solar cell module is calculated and determined whether it is less than the predetermined current threshold. This step is executed in a condition that the first balancer 131 is activated. If the absolute value is less than the predetermined current threshold, it means the output currents of the two solar cell modules are substantially the same, that is, the situation where one of the solar cell modules is shaded has been eliminated. Thus, the first balancer 131 will be switched to the stand-by state. If the absolute value is greater than or equal to the predetermined current threshold, it means the situation where one of the solar cell modules is shaded is not eliminated, and therefore, the first balancer 131 keeps operating in the turn-on state, and the process returns to step S301 for keeping detection to the first solar cell module 101 and the second solar cell module 102.

In step S304, the absolute value of a difference between the voltage value of the first solar cell module and the voltage value of the second solar cell module is calculated and determined whether it is less than the predetermined voltage threshold. This step is executed in a condition that the first balancer 131 is in the stand-by state. If the absolute value is greater than or equal to the predetermined voltage threshold, it means the situation where one of the solar cell modules is shaded has occurred. Thus, it is necessary to activate the first balancer 131 to execute balancing operation. If the absolute value is less than the predetermined voltage threshold, it means the output voltages of the two solar cell modules are substantially the same, that is, the situation where one of the solar cell modules is shaded does not exist, and therefore, the first balancer 131 keeps staying in the stand-by state, and the process returns to step S301 for keeping detection to the first solar cell module 101 and the second solar cell module 102.

By using the above method, it is possible to control the balancer to be in the stand-by state when the solar cell modules receive even illumination, and "waken" the balancer when the solar cell modules receive uneven illumination, thereby achieving the goal of saving energy consumption.

Figure 3B:
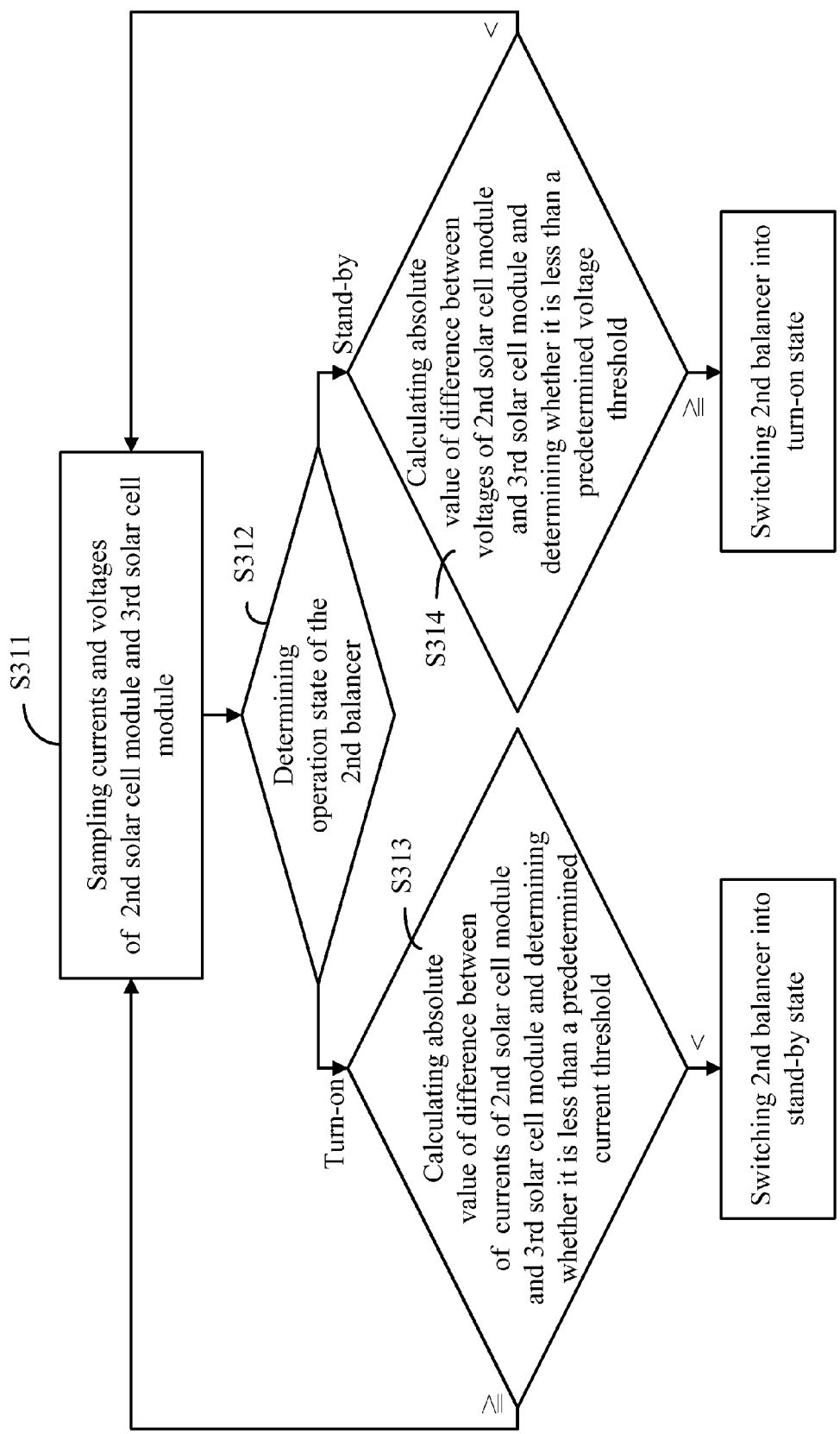

FIG. 3B shows a flow chart of a method according to another embodiment of the present disclosure, in which the solar cell pack includes multiple solar cell modules. The structure of the solar cell pack can be referred to FIG. 2A and FIG. 2B. In addition to the steps described in the previous embodiment, the method further comprises steps of: step S311. sampling current values and voltage values of the second solar cell module and the third solar cell module, respectively; step S312. determining an operation state of the second balancer, going to step S313 if it is the turn-on state, while going to step S314 if it is the stand-by state; step S313. calculating an absolute value of a difference between the current value of the second solar cell module and the current value of the third solar cell module and determining whether the absolute value is less than a predetermined current threshold, switching the second balancer into the stand-by state if the absolute value is less than the predetermined current threshold, while returning to step S311 if the absolute value is greater than or equal to the predetermined current threshold; step S314. calculating an absolute value of a difference between the voltage value of the second solar cell module and the voltage value of the third solar cell module and determining whether the absolute value is less than a predetermined voltage threshold, switching the second balancer into the turn-on state if the absolute value is greater than or equal to the predetermined voltage threshold, while returning to step S311 if the absolute value is less than the predetermined voltage threshold.

The relationships among the respective steps mentioned above and the operations thereof can be referred to the descriptions for FIG. 3A, and therefore the details are omitted herein.

While the preferred embodiments of the present disclosure have been illustrated and described in detail, various modifications and alterations can be made by persons skilled in this art. The embodiment of the present disclosure is therefore described in an illustrative but not restrictive sense. It is intended that the present disclosure should not be limited to the particular forms as illustrated, and that all modifications and alterations which maintain the spirit and realm of the present disclosure are within the scope as defined in the appended claims.

What is claimed is:
1. A solar cell pack comprising:
a first solar cell module;
a second solar cell module, a negative pole of the first solar cell module being electrically connected with a positive pole of the second solar cell module;

a first balancer electrically connected with the first solar cell module and the second solar cell module for balancing currents flowing through the two solar cell modules;

a sampler having an input terminal electrically connected with the first and second solar cell modules for respectively sampling a voltage between two poles of each solar cell module and a current between the two solar cell modules and the first balancer; and a control unit having an input terminal electrically connected with an output terminal of the sampler and an output terminal electrically connected with an input terminal of the first balancer.

2. The solar cell pack according to claim 1, wherein the first balancer has a first port electrically connected with a positive pole of the solar cell pack, a second port electrically connected with a negative pole of the solar cell pack and a third port electrically connected with a common terminal of the negative pole of the first solar cell module and the positive pole of the second solar cell module.

3. The solar cell pack according to claim 2, wherein the first balancer further comprises a first switch, a second switch and a first inductor, the first switch and the second switch are connected in series and electrically coupled between the first port and the second port of the first balancer, a first terminal of the first inductor is electrically connected with the third port of the first balancer, and a second terminal of the first inductor is electrically connected with a common terminal of the first switch and the second switch.

4. The solar cell pack according to claim 1, further comprising a third solar cell module and a second balancer, a negative pole of the second solar cell module is electrically connected with a positive pole of the first solar cell module, the second balancer is electrically connected with the second and third solar cell modules for balancing currents flowing through the two solar cell modules, the output terminal of the control unit is electrically connected with an input terminal of the second balancer, the input terminal of the sampler is further electrically connected with the third solar cell module for sampling a voltage between two poles of the third solar cell module and a current between the second and third solar cell modules and the second balancer.

5. The solar cell pack according to claim 4, wherein the second balancer has a first port electrically connected with the positive pole of the solar cell pack, a second port electrically connected with the negative pole of the solar cell pack and a third port electrically connected with a common terminal of the negative pole of the second solar cell module and the positive pole of the third solar cell module.

6. The solar cell pack according to claim 5, wherein the second balancer further comprises a third switch, a fourth switch and a second inductor, the third switch and the fourth switch are connected in series and electrically coupled between the first port and the second port of the second balancer, a first terminal of the second inductor is electrically connected with the third port of the second balancer, and a second terminal of the second inductor is electrically connected with a common terminal of the third switch and the fourth switch.

7. A method for balancing output currents of the solar cell modules in the solar cell pack as claimed in claim 1, the method comprising steps of:
(a) respectively sample currents and voltages of the first solar cell module and the second solar cell module;
(b) determining an operation state of the first balancer, executing step (c) if it is a turn-on state, while executing step (d) if it is a stand-by state;
(c) calculating an absolute value of a difference between the currents of the first solar cell module and the second solar cell module and determining whether it is less than a predetermined current threshold, switching the first balancer into the stand-by state if it is less than the predetermined current threshold, while returning to execute step (a) if it is greater than or equal to the predetermined current threshold; and
(d) calculating an absolute value of a difference between the voltages of the first solar cell module and the second solar cell module and determining whether it is less than a predetermined voltage threshold, switching the first balancer into the turn-on state if it is greater than or equal to the predetermined voltage threshold, while returning to execute step (a) if it is less than the predetermined voltage threshold.

8. The method according to claim 7, wherein the solar cell pack further comprises a third solar cell module and a second balancer, a negative pole of the second solar cell module is electrically connected with a positive pole of the third solar cell module, the second balancer is electrically connected with the second and third solar cell modules for balancing currents flowing through the two solar cell modules, the output terminal of the control unit is electrically connected with an input terminal of the second balancer, the input terminal of the sampler is further electrically connected with the third solar cell module, the method further comprising steps of
(a1) respectively sampling currents and voltages of the second solar cell module and the third solar cell module;
(b1) determining an operation state of the second balancer, executing step (c1) if it is a turn-on state, while executing step (d1) if it is a stand-by state;
(c1) calculating an absolute value of a difference between the currents of the second solar cell module and the third solar cell module and determining whether it is less than a predetermined current threshold, switching the second balancer into the stand-by state if it is less than the predetermined current threshold, while returning to execute step (a1) if it is greater than or equal to the predetermined current threshold; and
(d1) calculating an absolute value of a difference between the voltages of the second solar cell module and the third solar cell module and determining whether it is less than a predetermined voltage threshold, switching the second balancer into the turn-on state if it is greater than or equal to the predetermined voltage threshold, while returning to execute step (a1) if it is less than the predetermined voltage threshold.

\* \* \* \* \*